(12) United States Patent
Ganapathiappan et al.

(10) Patent No.: US 12,187,935 B1
(45) Date of Patent: Jan. 7, 2025

(54) LIQUID DISPERSION OF QUANTUM DOTS IN AN ACRYLIC MONOMER MEDIUM

(71) Applicant: Applied Materials, Inc., Santa Clara, CA (US)

(72) Inventors: Sivapackia Ganapathiappan, Los Altos, CA (US); Kulandaivelu Sivanandan, Fremont, CA (US); Nag Bhushanam Patibandla, Sunol, CA (US); Anthony Kipkorir, Notre Dame, IN (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/537,051

(22) Filed: Dec. 12, 2023

(51) Int. Cl.
*C09K 11/06* (2006.01)
*C09K 11/02* (2006.01)
*H10K 50/115* (2023.01)
*H10K 71/00* (2023.01)

(52) U.S. Cl.
CPC ............ *C09K 11/06* (2013.01); *C09K 11/025* (2013.01); *H10K 50/115* (2023.02); *H10K 71/00* (2023.02)

(58) Field of Classification Search
CPC .... C09K 11/06; C09K 11/025; H10K 50/115; H10K 71/00
See application file for complete search history.

(56) References Cited

U.S. PATENT DOCUMENTS

| | | | | |
|---|---|---|---|---|
| 6,310,189 B1 * | 10/2001 | Fodor | .................. | C07C 229/14 536/25.31 |
| 6,506,558 B1 * | 1/2003 | Fodor | ................ | G11C 13/0019 506/16 |
| 7,294,449 B1 * | 11/2007 | Gudeman | ............ | G03F 7/0047 430/270.1 |
| 8,343,627 B2 * | 1/2013 | Zhong | .............. | G01N 33/54326 428/403 |
| 9,812,004 B1 * | 11/2017 | Boshernitzan | ......... | G08C 17/02 |
| 9,831,706 B2 * | 11/2017 | MacWilliams | ........... | H02J 7/32 |
| 9,874,693 B2 * | 1/2018 | Baiocco | ................ | H01L 21/762 |
| 9,943,840 B2 * | 4/2018 | Shaffer | .................... | B01J 23/06 |
| 11,094,530 B2 | 8/2021 | Zhang et al. | | |
| 11,342,481 B2 | 5/2022 | Knisley et al. | | |
| 2007/0134699 A1 * | 6/2007 | Glover | ................. | B01J 19/0046 977/924 |
| 2010/0068522 A1 * | 3/2010 | Pickett | ................... | B82Y 30/00 977/773 |
| 2010/0113813 A1 * | 5/2010 | Pickett | ...................... | C09C 3/08 977/774 |

(Continued)

*Primary Examiner* — Caleb E Henry
(74) *Attorney, Agent, or Firm* — Servilla Whitney LLC

(57) ABSTRACT

Liquid dispersions of quantum dot particles comprise an acrylic medium and quantum dot particles dispersed in the acrylic medium have an initial viscosity. The quantum particles comprise ligands attached to the quantum dot particles, the ligands comprising functional groups configured to stabilize the initial viscosity liquid dispersion of the quantum dot particles. The liquid dispersions of quantum dot particles are useful as stable liquid formulations that resist gelling for spin-coating and inkjet printing of color conversion layers in the manufacture of LED and micro-LED panel for advanced displays. Methods of manufacturing light-emitting devices using the liquid dispersions of quantum dot particles are disclosed.

21 Claims, 5 Drawing Sheets

(56) References Cited

U.S. PATENT DOCUMENTS

| | | | |
|---|---|---|---|
| 2010/0213438 A1* | 8/2010 | Cho | H10K 50/156 438/47 |
| 2011/0006269 A1* | 1/2011 | Petruska | C01G 15/00 977/773 |
| 2011/0037029 A1* | 2/2011 | Liu | C08G 65/3322 252/500 |
| 2011/0294995 A1* | 12/2011 | Huo | B82Y 30/00 977/773 |
| 2012/0270231 A1* | 10/2012 | Smith | C09K 11/02 435/7.1 |
| 2012/0280345 A1* | 11/2012 | Zhu | G02B 6/1226 257/E31.127 |
| 2013/0004522 A1* | 1/2013 | Dvir | A61K 9/5138 424/178.1 |
| 2013/0146854 A1* | 6/2013 | Dong | H10K 50/12 438/45 |
| 2013/0345458 A1* | 12/2013 | Freeman | C08G 77/38 556/439 |
| 2014/0027816 A1* | 1/2014 | Cea | H01L 29/1054 257/E29.085 |
| 2014/0197507 A1* | 7/2014 | Assefa | H01L 31/0745 438/69 |
| 2015/0031217 A1* | 1/2015 | Naasani | C09K 11/883 438/780 |
| 2015/0091093 A1* | 4/2015 | Bouche | H01L 29/45 257/369 |
| 2015/0267106 A1* | 9/2015 | Pillay Narrainen | H01L 33/502 252/301.36 |
| 2015/0268417 A1* | 9/2015 | Assefa | H01L 27/1461 385/14 |
| 2018/0298154 A1* | 10/2018 | Lundorf | C04B 35/48 |
| 2019/0302615 A1* | 10/2019 | Krysak | G03F 7/0043 |
| 2020/0131435 A1* | 4/2020 | Pousthomis | B01J 19/06 |
| 2020/0373279 A1* | 11/2020 | Ganapathiappan | G03F 7/0007 |
| 2021/0179939 A1* | 6/2021 | Stokes | C09K 11/565 |
| 2021/0234076 A1* | 7/2021 | Kwok | C09J 5/00 |
| 2022/0029068 A1 | 1/2022 | Luo et al. | |
| 2022/0145174 A1* | 5/2022 | Lee | C08G 77/20 |
| 2022/0399479 A1 | 12/2022 | Xu et al. | |
| 2023/0006110 A1 | 1/2023 | Luo et al. | |
| 2023/0290909 A1 | 9/2023 | Li et al. | |
| 2023/0348778 A1 | 11/2023 | Sivanandan et al. | |

* cited by examiner

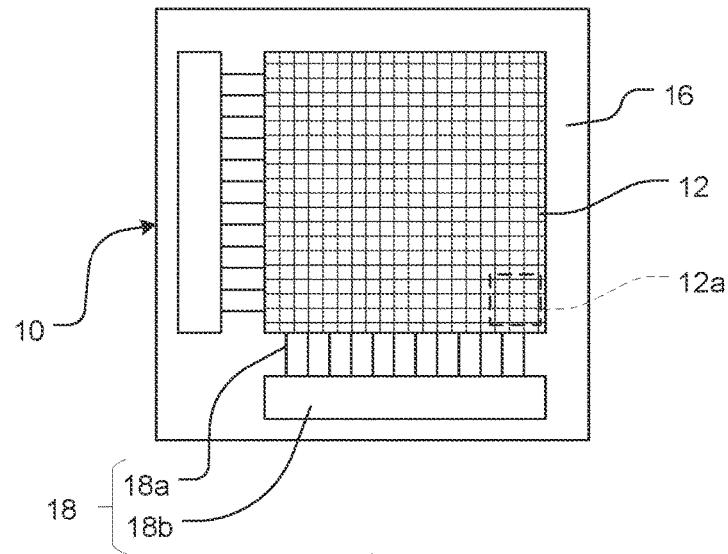
FIG. 1
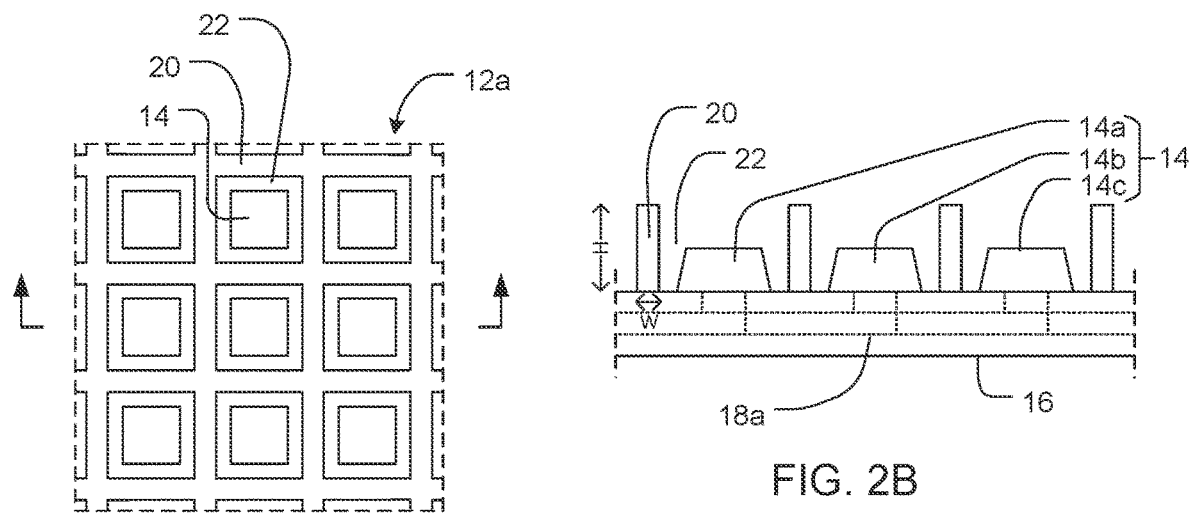
FIG. 2A
FIG. 2B

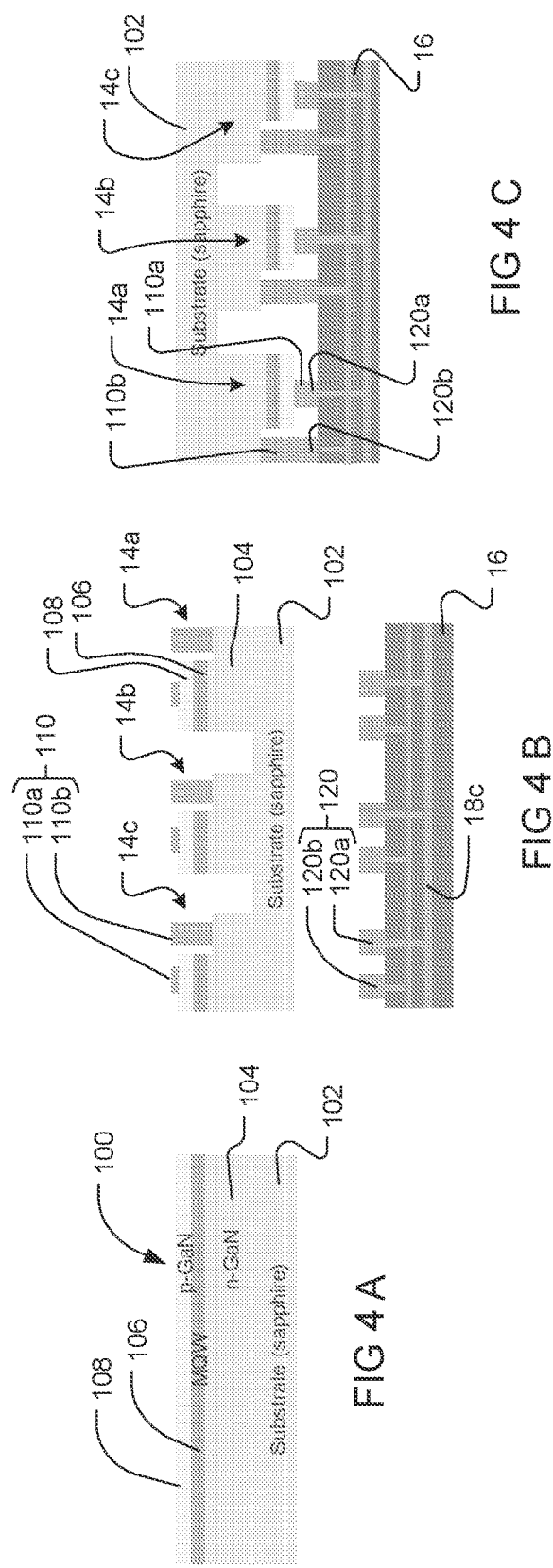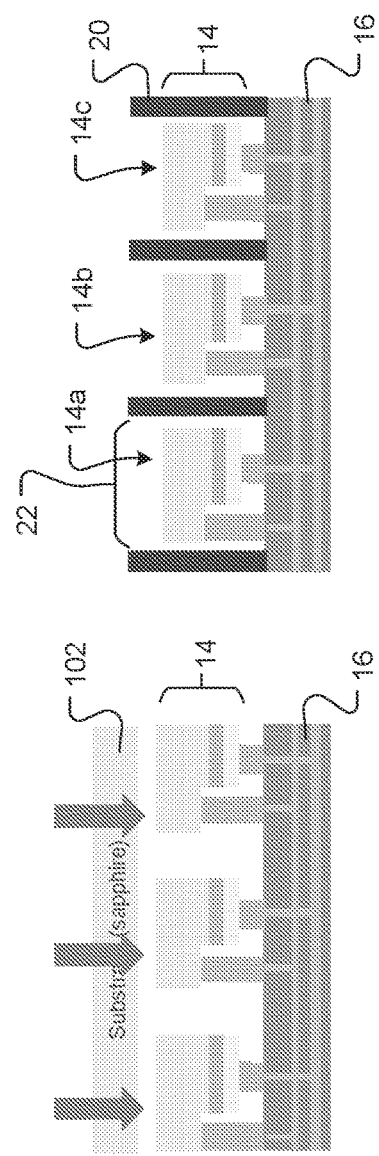

LIQUID DISPERSION OF QUANTUM DOTS IN AN ACRYLIC MONOMER MEDIUM

TECHNICAL FIELD

Embodiments of the disclosure generally relate to liquid dispersions of quantum dot particles used in the formation of color conversion layers in the manufacture of LED panels and micro-LED panels of display devices.

BACKGROUND

A light emitting diode (LED) panel uses an array of LEDs, with individual LEDs providing the individually controllable pixel elements. Such an LED panel can be used for a computer, touch panel device, personal digital assistant (PDA), cell phone, television monitor, and the like.

An LED panel that uses micron-scale LEDs based on III-V semiconductor technology (also called micro-LEDs) would have a variety of advantages as compared to OLEDs, e.g., higher energy efficiency, brightness, and lifetime, as well as fewer material layers in the display stack which can simplify manufacturing. However, there are challenges to fabrication of micro-LED panels. Micro-LEDs having different color emission (e.g., red, green, and blue pixels) need to be fabricated on different substrates through separate processes. Integration of the multiple colors of micro-LED devices onto a single panel typically requires a pick-and-place step to transfer the micro-LED devices from their original donor substrates to a destination substrate. This often involves modification of the LED structure or fabrication process, such as introducing sacrificial layers to ease die release. In addition, stringent requirements on placement accuracy can limit the throughput, the final yield, or both.

An alternative approach to bypass the pick-and-place step is to selectively deposit color conversion agents (e.g., quantum dots, nanostructures, photoluminescent materials, or organic substances) at specific pixel locations on a substrate fabricated with monochrome LEDs. The monochrome LEDs can generate relatively short wavelength light, e.g., purple or blue light, and the color conversion agents can convert this short wavelength light into longer wavelength light, e.g., red or green light for red or green pixels. The selective deposition of the color conversion agents can be performed using high-resolution shadow masks or controllable inkjet or aerosol jet printing. Print materials comprising liquid dispersions of quantum dot materials in an acrylic medium are used for spin-coating and inkjet and aerosol jet printing of the liquid dispersions.

Liquid dispersions of quantum dot particles in acrylic monomers are often not stable, particularly the viscosity of the liquid dispersions, which have a tendency to phase separate over time and increase in viscosity, forming gels. This problem is particularly difficult with blue and green quantum dot particles. Thus, liquid dispersions of quantum dot materials have short shelf lives, resulting in detrimental effects in the usage of these materials to form color conversion layers in display devices. Dispersion stability is a critical problem limiting the use of liquid dispersions of quantum dot particles, and it would be desirable to provide liquid dispersions of quantum dot particles exhibiting improved dispersion stability and loner shelf life.

SUMMARY

One or more embodiments of the disclosure are directed to a liquid dispersion of quantum dot particles comprising an acrylic medium; and quantum dot particles dispersed in the acrylic medium having an initial viscosity, the quantum dot particles comprising ligands attached to the quantum dot particles, the ligands comprising functional groups that stabilize the initial viscosity of the liquid dispersion of quantum dot particles to prevent an increase in the initial viscosity that causes gelling of the liquid dispersion of quantum dot particles.

Another embodiment pertains to a method of fabricating a light-emitting device, the method comprising depositing a photocurable liquid dispersion of quantum dot particles onto an array of LEDs or micro-LEDs that are integrated with backplane circuitry, wherein the photocurable liquid dispersion of quantum dot particles includes an acrylic medium, a photoinitiator and quantum dot particles dispersed in the acrylic medium having an initial viscosity, the quantum dot particles comprising ligands attached to the quantum dot particles on the outside surface, the ligands comprising functional groups that stabilize the initial viscosity of the liquid dispersion of the quantum dot particles to prevent an increase in the initial viscosity that causes gelling of the liquid dispersion of quantum dot particles; activating a plurality of the LEDs or the micro-LEDs from the array of the LEDS or the micro-LEDs to illuminate the photocurable liquid dispersion of quantum dot particles over the plurality of the LEDS or the micro-LEDs with light in a second wavelength band in the UV or visible light range that causes the photoinitiator to initiate polymerization of the liquid dispersion of quantum dot particles and causes the quantum dots to emit light in a different first wavelength band in the visible light range; and removing an uncured portion of the photocurable liquid dispersion of quantum dot particles from the array of the LEDS or the micro-LEDs

BRIEF DESCRIPTION OF THE DRAWINGS

FIG. 1 is a schematic top view of a micro-LED array that has already been integrated with a backplane;

FIG. 2A is a schematic top view of a portion of a micro-LED array. FIG. 2B is a schematic cross-sectional view of the portion of the micro-LED array from FIG. 2A;

FIGS. 4A-4E illustrate a method of fabricating a micro-LED array and isolation walls on a backplane.

Figure 3A:
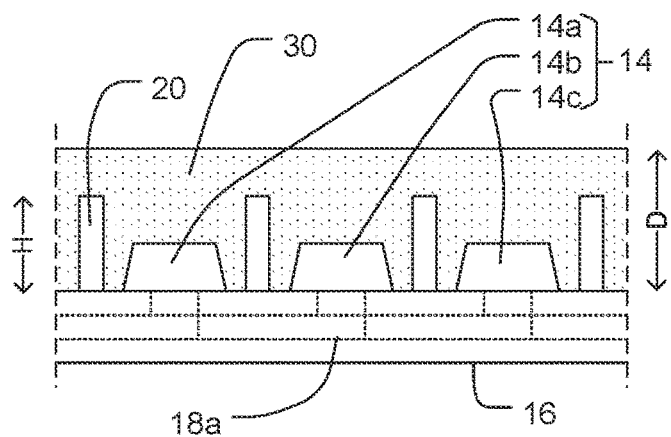
FIGS. 3A-3H illustrate a method of selectively forming color conversion layers over a micro-LED array.

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which color conversion layers in the manufacture of LED panels and micro-LED panels of display devices are deposited. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon. A "substrate" as used herein, refers to any substrate or material surface used during color conversion layers in the manufacture of LED panels and micro-LED panels of display devices. For example, a substrate surface formation of can be performed include materials such as glass, sapphire, and any other materials such as metals, semiconductors and plastics.

The ambient stability of dispersions of quantum dot particles used in printing and spin-coating of color conversion layers in the manufacture of LED panels and micro-LED panels, and in particular, blue and green quantum dots is a problem, particularly, the viscosity stability that increases over time and with exposure to ambient conditions. Dispersions of quantum dot particles include an acrylic medium that are cured using in-situ curing processes during formation of the color conversion layers. Embodiments of the disclosure provide liquid dispersions of quantum dot particles that are stable over time and maintain their initial viscosity to prevent gelling of the dispersions.

Quantum dots dispersed in an acrylic medium, (e.g., acrylate formulations) are provided that can be used spin-coating and inkjet printing. After UV curing of the liquid dispersion, the quantum dots are locked in a polyacrylate matrix and can be used as a color conversion layer for advanced displays.

As described in this disclosure, a liquid dispersion for a micro-LED color conversion layer typically includes a color conversion agent (e.g., quantum dots), a reactive component, and a photoinitiator. The liquid dispersion may optionally include one or more of a solvent (e.g., a monomer), a functional component (e.g., high refraction index additive, a surfactant, a stray light absorber or UV blocker).

The color conversion agents are materials that emit visible radiation in a first visible wavelength band in response to absorption of UV radiation or visible radiation in a second visible wavelength band. The UV radiation typically has a wavelength in a range of 200 nm to 400 nm. The visible radiation typically has a wavelength or wavelength band in a range of 400 nm to 800 nm. The first visible wavelength band is different (e.g., more energetic) than the second visible wavelength band. That is, the color conversion agents are materials that can convert the shorter wavelength light from a micro-LED into longer wavelength light.

The color conversion agents include photoluminescent materials, such as organic or inorganic molecules, nanomaterials (e.g., nanoparticles, nanostructures, quantum dots), or other appropriate materials. Suitable nanomaterials typically include one or more III-V compounds. Examples of suitable III-V compounds include CdSe, CdS, InP, PbS, CuInP, ZnSeS, and GaAs. In some cases, the nanomaterials include one or more elements selected from the group consisting of cadmium, indium, copper, silver, gallium, germanium, arsenide, aluminum, boron, iodide, bromide, chloride, selenium, tellurium, and phosphorus. In certain cases, the nanomaterials include one or more perovskites.

At least one of the color conversion agents includes photoluminescent quantum dots. Photoluminescent quantum dots typically include one or more III-V compounds. Examples of suitable III-V compounds include CdSe, CdS, InP, PbS, CuInP, ZnSeS, and GaAs. The quantum dots can be homogeneous or can have a core-shell structure. The quantum dots can have an average diameter in a range of about 1 nm to about 10 nm. One or more organic ligands are coupled to an exterior surface of the quantum dots. The organic ligands promote dispersion of the quantum dots in solvents (e.g., monomers).

At least one of the color conversion agents includes photoluminescent quantum dots. Photoluminescent quantum dots typically include one or more III-V compounds. Examples of suitable III-V compounds include CdSe, CdS, InP, PbS, CuInP, ZnSeS, and GaAs. The quantum dots can be homogeneous or can have a core-shell structure. The quantum dots can have an average diameter in a range of about 1 nm to about 10 nm. One or more organic ligands are typically coupled to an exterior surface of the quantum dots. The organic ligands promote dispersion of the quantum dots in solvents (e.g., monomers). Commercially available quantum dots typically include quantum dot precursor materials (e.g., metal atoms and ions) along with the quantum dots.

Dispersion formulations that are in-situ cured in the formation of color conversion layer for advanced displays include an acrylic medium. Ambient stability of the dispersion formulations including liquid dispersions of quantum dot particles is important to ensure that the quantum dot particles do not settle in the print lines and in the printhead nozzles. Embodiments of the present disclosure advantageously provide liquid dispersions of quantum dot particles that can be suspended in acrylic medium for greater than 16 hours, 24 hours, one day, one week, one month and up to six months either under inert atmosphere or ambient conditions without a substantial increase in viscosity that causes the formulation to gel. Advantageously, embodiments provide dispersion stability for spin-coating and ink-jetting applications that prevents settlement of the quantum dot particles along the delivery lines supplying the dispersion formulation connected to the printhead. Settling of the quantum dot particles and high viscosity has a detrimental effect on printing of the quantum dot formulations accurately. The liquid dispersions of quantum dot particle greatly reduce these issues and solve a long-standing problem of viscosity stability of quantum dot particle dispersions.

In addition, embodiments provided in this disclosure avoid clogging in the printhead due to the accumulation of particles that clog the printhead nozzle. Stability of green and blue quantum dot particles is the worst among the red, green and blue quantum dot particles. Embodiments described herein improve the stability of dispersions of quantum dot particles, by selection of proper ligand structure that quantum dot particles are stably suspended without any gelation. Quantum dot particles are sensitive to oxygen and moisture that accelerate gelling. The ligands described in this disclosure provide coverage of the surface of quantum dot particles and prevent interaction with oxygen and moisture that cause gelling. In one or more embodiments, the ligands described herein form a monolayer over the surface of quantum dot particles and prevent interaction with oxygen and moisture and prevent gelling. In one or more embodiments, the monolayer is continuous and does not include any openings that expose a portion of the quantum dot particles.

It was determined that ligands including primary amines (e.g. butylamine) react with acrylic monomers. According to one or more embodiments, secondary amine ligands such as dibutylamine are used and avoid the reaction with acrylic monomers. It was also determined that certain thiols (dodecanethiol, 4-bis(3-mercaptobutyryloxy) butane and 3-mercaptosuccinic acid) tend to form gels or promote reaction with the acrylic monomer in dispersions of quantum dot particles, causing interaction with another particle leading to aggregation of the particles. In one or more embodiments, acid containing ligands, for example, 9-decenoic acid provided greater stability of liquid dispersion of quantum dot particles. While the present disclosure should not be bound by a particular theory, it is believed that the surface reactivity of the ligands described herein with the quantum dot particles is better and the proper chain length to suspend the particles better than other ligands. Embodiments of the ligands described in this disclosure serve as dual purpose to stably support the quantum dot particles in an acrylic medium and an olefin functional group cross-links with the matrix of the quantum dot particles during UV curing. This can greatly improve the mechanical properties of the color conversion layer and can prevent diffusion of ligands over time with the adjacent layer materials such as barrier layers or encapsulation layers. The presence of olefinic groups in the ligands has added benefits for improving the matrix. The mixed ligands are also beneficial to improve the stability.

Thus according to one or more embodiments, liquid dispersion of quantum dot particles comprises an acrylic medium and quantum dot particles dispersed in the acrylic medium having an initial viscosity, the quantum particles comprising ligands attached to the quantum dot particles, the ligands comprising functional groups configured to stabilize the initial viscosity liquid dispersion of the quantum dot particles. In one or more embodiments, configured to stabilize the initial viscosity may refer to preventing an increase in the initial viscosity that causes gelling of the liquid dispersion of quantum dot particles.

In one or more embodiments, upon exposure to ambient air for 24 hours, the dispersion exhibits a changed viscosity that does not increase more than two times the initial viscosity. In some embodiments the changed viscosity is less than three times, less than four times, less than five times, less than ten times, less than twenty times, less than thirty times, less than forty times or less than 50 times the initial viscosity after exposure to ambient air.

The liquid dispersion of quantum dot particles according to one or more embodiments comprises 5 to 50 weight percent, 5 to 40 weight percent, 5 to 35 weight percent or 5 to 30 weight percent quantum dot particles. In one or more embodiments, the ligand concentration of the liquid dispersion of quantum dot particles comprises 1 to 50 weight percent, 5 to 40 weight percent, 5 to 35 weight percent or 5 to 30 weight percent of the liquid dispersion. The remainder of the liquid dispersion comprises the acrylic medium, a reactive component, and a photoinitiator. The liquid dispersion may optionally include one or more of a solvent, a functional component (e.g., high refraction index additive, a surfactant, a surface tension additive, a stray light absorber or UV blocker).

In one or more embodiments, the ligands comprise one or more of dialkylamine ligands and ligands having acid and olefin functional groups. In some embodiments, the dialkylamine ligands include an alkyl group having from 4 to 16 carbon atoms.

In one or more embodiments, the one or more of dialkylamine ligands are selected from the group consisting of dibutylamine, dihexylamine, dioctylamine dipentylamine, diheptylamine, and dinonylamine. In one or more embodiments, the ligands having acid and olefin functional groups comprise dodecenoic acid. In a specific embodiment the ligands having acid and olefin functional groups comprise 9-dodecenoic acid.

In some embodiments, the acrylic medium comprises one or more of an acrylate monomer, a diacrylate monomer and an acrylamide monomer. In one or more embodiments, the acrylic medium is selected from the group consisting of hexanediol diacrylate, butanediol diacrylate, ethylene glycol diacrylate, hexyl acrylate, 2-ethylhexyl acrylate, octyl acrylate, 9-(acryloyloxy) nonyl acrylate, isobornyl acrylate, diethylacrylamide and mixtures thereof. In specific embodiments, the acrylic medium is hexanediol diacrylate. In some specific embodiments, the ligand comprises 9-dodecenoic acid and the acrylic medium comprises hexanediol diacrylate.

According to one or more embodiments, the liquid dispersion of quantum dot particles is a photocurable composition in the form of an ink formulation and has surface tension of 15-35 dyne/cm, for example, 20-25 dyne/cm. In one or more embodiments, the viscosity of liquid dispersion of quantum dot particles is in the range of 5 to 200 centipoise at ambient temperature (25° C.) measured using a Brookfield Cone and Plate Viscometer Model R/S Plus. The viscosity of the liquid dispersion of quantum dot particles is stable for greater than 16 hours, 24 hours, one day, one week, one month and up to six months without a substantial increase in viscosity that causes the formulation to gel. According to one or more embodiments, herein "stable" and "without a substantial increase in viscosity" refers to the dispersion exhibits a changed viscosity that does not increase more than two times the initial viscosity. As used in this disclosure, "initial viscosity" refers to the viscosity measured at room temperature using a Brookfield Cone and Plate Viscometer Model R/S Plus of a liquid dispersion of quantum dot particles immediately after (e.g., within 5 minutes) exposure of the liquid dispersion to ambient air. In some embodiments the changed viscosity is less than three times, less than four times, less than five times, less than ten times, less than twenty times, less than thirty times, less than forty times or less than 50 times the initial viscosity after exposure to ambient air. In one or more embodiments, when the liquid dispersion of quantum dot is cured to form a cross-linked matrix exhibiting the desired mechanical properties, the ligands disclosed herein participate in the curing to obtain the cross-linked matrix.

An experiment was conducted in which a liquid dispersion including green quantum dot particles having a ligand as described herein and an acrylic medium was compared to an existing commercial sample. When the existing commercial sample was exposed to ambient air, the initial viscosity prior to exposure to ambient was about 20 centipoise at room temperature. After 16 hours, the viscosity of the existing commercial sample at room temperature increased nearly 3 times to 60 centipoise. However, a liquid dispersion made in accordance with embodiments described herein, namely, when a ligand comprised one or more of dialkylamine ligands and ligands having acid and olefin functional groups, the viscosity of the liquid dispersion including green quantum dot particles increased by less than 10% compared to the initial viscosity.

As described in this disclosure, a liquid dispersion for an LED or a micro-LED color conversion layer typically includes a reactive component and a photoinitiator. The liquid dispersion may optionally include one or more of a solvent, a functional component (e.g., high refraction index additive, a surfactant, a stray light absorber or UV blocker).

The reactive components include monomers, such as (meth)acrylate monomers, and can include one or more mono(meth)acrylates, di(meth)acrylates, tri(meth)acrylates, tetra(meth)acrylates, or a combination thereof. The reactive components can be provided by a negative photoresist, e.g., SU-8 photoresist. Examples of suitable mono(meth)acrylates include isobornyl (meth)acrylates, cyclohexyl (meth) acrylates, trimethylcyclohexyl (meth)acrylates, diethyl (meth)acrylamides, dimethyl (meth)acrylamides, and tetrahydrofurfuryl (meth)acrylates. The reactive component may include cross-linkers or other reactive compounds. Examples of suitable cross-linkers include polyethylene glycol di(meth)acrylates (e.g., diethylene glycol di(meth) acrylate or tripropylene glycol di(meth)acrylates), neopentyl glycol di(meth)acrylate, N,N'-methylenebis-(meth)acrylamides, trimethylolpropane tri(meth)acrylate, pentaerythritol tri(meth)acrylates, and pentaerythritol tetra(meth)acrylates. Examples of suitable reactive compounds include polyethylene glycol (meth)acrylates, vinylpyrrolidone, vinylimidazole, (meth)acrylamides, alkyl(meth)acrylamides, dialkyl (meth)acrylamides), hydroxyethyl (meth)acrylates, morpholinoethyl acrylates, and vinylformamides.

The photoinitiator initiates polymerization in response to radiation such as UV radiation, UV-LED radiation, visible radiation, and electron beam radiation. In some cases, the photoinitiator is responsive to UV or visible radiation. Suitable photoinitiators include free radical photoinitiators, such as bulk cure photoinitiators and surface cure photoinitiators.

Bulk cure photoinitiators cleave upon exposure to UV radiation, yielding a free radical, which may initiate polymerization. Bulk cure photoinitiators can be useful for both surface and through or bulk cure of the dispensed droplets. Bulk cure photoinitiators include benzoin ethers, benzyl ketals, acetyl phenones, alkyl phenones, phosphine oxides, benzophenone compounds, and thioxane compounds.

Surface cure photoinitiators are activated by UV radiation and form free radicals by hydrogen abstraction from a second compound, which becomes the actual initiating free radical. This second compound is often called a co-initiator or polymerization synergist, and may be an amine synergist. Amine synergists are used to diminish oxygen inhibition, and therefore, surface cure photoinitiators can be useful for fast surface cures. Surface cure photoinitiators include benzophenone compounds and thioxanthone compounds. An amine synergist is an amine with an active hydrogen. Amine synergists, such as amine-containing acrylates, may be combined with a benzophenone photoinitiator in a resin precursor composition formulation to a) limit oxygen inhibition, b) fast cure a droplet or layer surface so as to fix the dimensions of the droplet or layer surface, and c), increase layer stability through the curing process.

Examples of suitable photoinitiators include 1-hydroxycyclohexylphenyl ketone, 4-isopropylphenyl-2-hydroxy-2-methyl propan-1-one, 1-[4-(2-hydroxyethoxy)-phenyl]-2-hydroxy-2-methyl-1-propan-1-one, 2,2-dimethyl-2-hydroxy-acetophenone, 2,2-dimethoxy-2-phenylacetophenone, 2-hydroxy-2-methylpropionphenone, diphenyl (2,4,6-trimethylbenzoyl) phosphine oxide, bis(2,6-dimethoxy-benzoyl)-2,4,6 trimethyl phenyl phosphine oxide, 2-methyl-1-1 [4-(methylthio)phenyl]-2-morpholino-propan-1-one, 3,6-bis(2-methyl-2-morpholino-propionyl)-9-n-octylcarbazole, 2-benzyl-2-(dimethylamino)-1-(4-morpholinyl)phenyl)-1-butanone, benzophenone, 2,4,6-trimethylbenzophenone, isopropyl thioxanthone, phenylbis (2,4,6-trimethylbenzoyl) phosphine oxide, 2-hydroxy-2-methyl-1phenyl-1-propanone. Suitable blends of photoinitiators commercially available include Darocur 4265, Irgacure 184, Irgacure 250, Irgacure 270, Irgacure 295, Irgacure 369, Irgacure 379, Irgacure 500, Irgacure 651, Irgacure 754, Irgacure 784, Irgacure 819, Irgacure 907, Irgacure 1173, Irgacure 2100, Irgacure 2022, Irgacure 4265, Irgacure TPO, Irgacure TPO-L, Esacure KT37, Esacure KT55, Esacure KT0046, Omnicat 250, and Omnicat 550. Suitable amine synergists include secondary and tertiary amine compounds with or without acrylic groups, such as diethanolamine, triethanolamine, and Genomer 5142.

Optionally, the photocurable composition can include a solvent. The solvent can be organic or inorganic. Examples of suitable solvents include ethanol, toluene, dimethylformamide, methylethylketone, or a combination thereof. The solvent can be selected to provide a desired surface tension or viscosity for the photocurable composition. The solvent can also improve chemical stability of the other components.

Optionally, the photocurable composition can include a stray light absorber or a UV blocker. Examples of suitable straylight absorbers include Disperse Yellow 3, Disperse Yellow 7, Disperse Orange 13, Disperse Orange 3, Disperse Orange 25, Disperse Black 9, Disperse Red 1 acrylate, Disperse Red 1 methacrylate, Disperse Red 19, Disperse Red 1, Disperse Red 13, and Disperse Blue 1. Examples of suitable UV blockers include benzotriazolyl hydroxyphenyl compounds.

Optionally, the first photocurable composition can include one or more other functional ingredients. As one example, the functional ingredients can affect the optical properties of the color conversion layer. For example, the functional ingredients can include nanoparticles with a sufficiently high index of refraction (e.g., at least about 1.7) that the color conversion layer functions as an optical layer that adjusts the optical path of the output light, e.g., provides a microlens. Examples of suitable nanoparticles include $TiO_2$, $ZnO_2$, $ZrO_2$, $CeO_2$, $Al_2O_3$, $ZnO_2$, $SiO_2$ or a mixture of two or more of these oxides. Alternatively or in addition, the nanoparticles can have an index of refraction selected such that the color conversion layer functions as an optical layer that reduces total reflection loss, thereby improving light extraction. As another example, the functional ingredients can include a dispersant or surfactant to adjust the surface tension of the photocurable composition. Examples of suitable dispersants or surfactants include siloxane and polyethylene glycol. As yet another example, the functional ingredients can include a photoluminescent pigment or phosphors including nanophosphors that emits visible radiation. Examples of suitable photoluminescent pigments include zinc sulfide and strontium aluminate.

The photocurable composition can optionally include up to about 5 wt % of a surfactant or dispersant, about 0.01 wt % to about 5 wt % (e.g., about 0.1 wt % to about 1 wt %) of a straylight absorber, or any combination thereof.

A viscosity of the photocurable composition is typically in a range of about 10 CP (centiPoise) to about 2000 cP at room temperature (e.g., about 10 cP to about 150 cP). Viscosity was measured at room temperature using a Brookfield Cone and Plate Viscometer Model R/S Plus. A surface tension of the photocurable composition is typically in a range of about 20 milliNewtons per meter (mN/m) to about 60 mN/m (e.g., about 40 mN/m to about 60 mN/m. The photocurable composition can be applied in one or more layers, and a thickness of the cured photocurable composition is typically in a range of about 10 nm to about 100 microns (e.g., about 10 nm to about 20 microns, about 10 nm to about 1000 nm, or about 10 nm to about 100 nm).

The photocurable compositions described in this disclosure are implemented as color conversion layers in displays, such as micro-LED displays described with respect to FIGS. 1-5. While FIGS. 1-5 illustrate micro-LEDs, the liquid dispersion of quantum dot materials can be used in the manufacture of LEDs. The cured composition typically includes a color conversion agent comprising quantum dots, a photopolymer, and components of a photoinitiator that initiates photopolymerization of the photopolymer in response to absorption of radiation.

FIG. 1 illustrates a micro-LED display 10 that includes an array 12 of individual micro-LEDs 14 (see FIGS. 2A and 2B) disposed on a backplane 16. The micro-LEDs 14 are already integrated with backplane circuitry 18 so that each micro-LED 14 can be individually addressed. For example, the backplane circuitry 18 can include a TFT active matrix array with a thin-film transistor and a storage capacitor (not illustrated) for each micro-LED, column address and row address lines 18a, column and row drivers 18b, etc., to drive the micro-LEDs 14. Alternatively, the micro-LEDs 14 can be driven by a passive matrix in the backplane circuitry 18. The backplane 16 can be fabricated using conventional CMOS processes.

FIGS. 2A and 2B illustrate a portion 12a of the micro-LED array 12 with the individual micro-LEDs 14. All of the micro-LEDs 14 are fabricated with the same structure so as to generate the same wavelength range (this can be termed "monochrome" micro-LEDs). For example, the micro-LEDs 14 can generate light in the ultraviolet (UV), e.g., the near ultraviolet range. For example, the micro-LEDs 14 can generate light in a range of 365 to 405 nm. As another example, the micro-LEDs 14 can generate light in the violet or blue range. The micro-LEDs can generate light having a spectral bandwidth of 20 to 60 nm.

FIG. 2B illustrates a portion of the micro-LED array that can provide a single pixel. Assuming the micro-LED display is a three-color display, each pixel includes three sub-pixels, one for each color, e.g., one each for the blue, green and red color channels. As such, the pixel can include three micro-LEDs 14 a, 14 b, 14 c. For example, the first micro-LED 14 a can correspond to a blue subpixel, the second micro-LED 14 b can correspond to a green subpixel, and the third micro-LED 14 c can correspond to a red subpixel. However, the techniques discussed below are applicable to micro-LED displays that use a larger number of colors, e.g., four or more colors. In this case, each pixel can include four or more micro-LEDs, with each micro-LED corresponding to a respective color. In addition, the techniques discussed below are applicable to micro-LED displays that use just two colors.

In general, the monochrome micro-LEDs 14 can generate light in a wavelength range having a peak with a wavelength no greater than the wavelength of the highest-frequency color intended for the display, e.g., purple or blue light. The color conversion agents can convert this short wavelength light into longer wavelength light, e.g., red or green light for red or green subpixels. If the micro-LEDs generate UV light, then color conversion agents can be used to convert the UV light into blue light for the blue subpixels.

Vertical isolation walls 20 are formed between neighboring micro-LEDs. The isolation walls provide for optical isolation to help localize polymerization and reduce optical crosstalk during the in-situ polymerization discussed below. The isolation walls 20 can be a photoresist or metal, and can be deposited by conventional lithography processes. As shown in FIG. 2A, the walls 20 can form a rectangular array, with each micro-LED 14 in an individual recess 22 defined by the walls 20. Other array geometries, e.g., hexagonal or offset rectangular arrays, are also possible. Possible processes for back-plane integration and isolation wall formation are discussed in more detail below.

The walls can have a height H of about 3 to 20 μm. The walls can have a width W of about 2 to 10 μm. The height H can be greater than the width W, e.g., the walls can have an aspect ratio of 1.5:1 to 5:1. The height H of the wall is sufficient to block light from one micro-LED from reaching an adjacent micro-LED.

A photocurable composition (e.g., first photocurable composition, second photocurable composition, a third photocurable composition, etc.) includes a polymerizable components, a photoinitiator to trigger polymerization under illumination of a wavelength corresponding to the emission of the micro-LEDs 14, and color conversion agents. The polymerizable component 32 includes a reactive component and an anti-oxygen inhibition additive as described herein.

After curing of the photocurable composition, components of the photoinitiator 34 may be present in the cured photocurable composition (the photopolymer), where the components are fragments of the photoinitiator formed during breaking of bonds in the photoinitiator in the photoinitiation process.

Returning to FIG. 3A, the first photocurable composition can be deposited on the display over the micro-LED array by a spin-on, dipping, spray-on, or inkjet process. An inkjet process can be more efficient in consumption of the first photocurable composition.

Figure 3B:
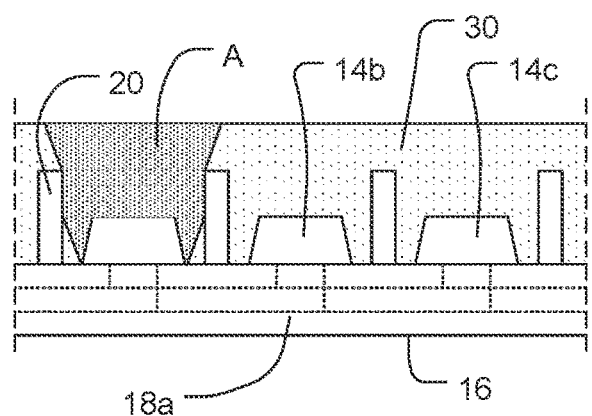

Next, as shown in FIG. 3B, the circuitry of the backplane 16 is used to selectively activate a first plurality of micro-LEDs 14a. This first plurality of micro-LEDs 14a correspond to the sub-pixels of a first color. In particular, the first plurality of micro-LEDs 14a correspond to the sub-pixels for the color of light to be generated by the color conversion agents in the photocurable composition. For example, assuming the color conversion agents in the first photocurable composition will convert light from the micro-LED 14 into blue light, then only those micro-LEDs 14a that correspond to blue sub-pixels are turned on. Because the micro-LED array is already integrated with the backplane circuitry 18, power can be supplied to the micro-LED display 10 and control signals can be applied by a microprocessor to selectively turn on the micro-LEDs 14a.

Figure 3C:
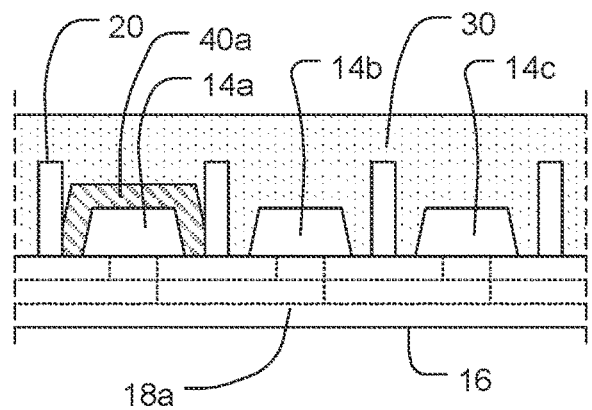

Referring to FIGS. 3B and 3C, activation of the first plurality of micro-LEDs 14a generates illumination A (see FIG. 3B) which causes in-situ curing of the first photocurable composition to form a first solidified color conversion layer 40a (see FIG. 3C) over each activated micro-LED 14a. In short, the first photocurable composition is cured to form color conversion layers 40a, but only on the selected micro-LEDs 14a. For example, a color conversion layer 40a for converting to blue light can be formed on each micro-LED 14a.

In some implementations, the illumination from the selected micro-LEDs 14a does not reach the other micro-LEDs 14b, 14c. In this circumstance, the isolation walls 20 may not be necessary. However, if the spacing between the micro-LEDs 14 is sufficiently small, isolation walls 20 can affirmatively block illumination A from the selected micro-LED 14a from reaching the area over the other micro-LEDs that would be within the penetration depth of the illumination from those other micro-LEDs. Isolation walls 20 can also be included, e.g., simply as insurance against illumination reaching the area over the other micro-LEDs.

The driving current and drive time for the first plurality of micro-LEDs 14a can be selected for appropriate photon dosage for the photocurable composition. The power per subpixel for curing the first photocurable composition is not necessarily the same as the power per subpixel in a display mode of the micro-LED display 10. For example, the power per subpixel for the curing mode can be higher than the power per subpixel for the display mode.

Figure 3D:
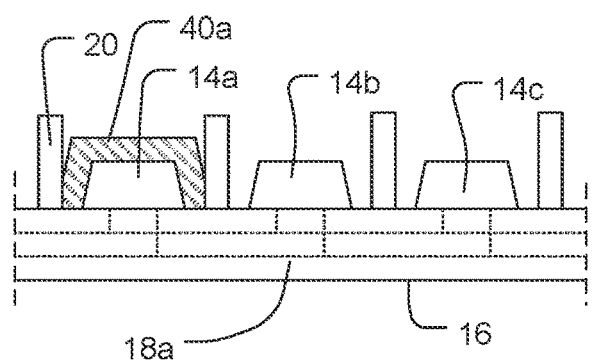

Referring to FIG. 3D, when curing is complete and the first solidified color conversion layer 40a is formed, the residual uncured first photocurable composition is removed from the display 10. This leaves the other micro-LEDs 14b, 14c, exposed for the next deposition steps. In some implementations, the uncured first photocurable composition is simply rinsed from the display with a solvent, e.g., ethanol, isopropanol, toluene, propylene glycol monomethyl ether acetate, dimethylformamide, or methylethylketone, or a combination thereof. If the photocurable composition includes a negative photoresist, then the rinsing fluid can include a photoresist developer for the photoresist.

Figure 3E:
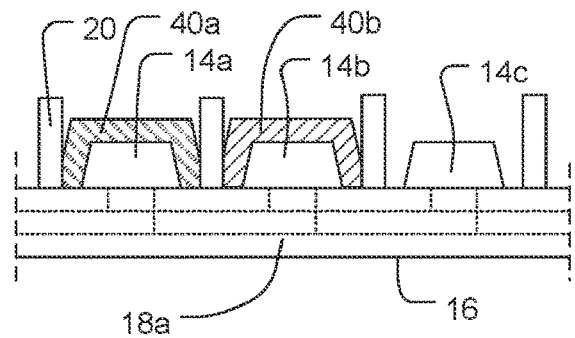

Referring to FIG. 3E, the treatment described above with respect to FIGS. 3A-3D is repeated, but with a second photocurable composition and activation of a second plurality of micro-LEDs 14b. After rinsing, a second color conversion layer 40b is formed over each of the second plurality of micro-LEDs 14b.

The second photocurable composition is similar to the first photocurable composition but includes color conversion agents to convert the shorter wavelength light from the micro-LEDs 14 into longer wavelength light of a different second color. The second color can be, for example, green.

The second plurality of micro-LEDs 14b correspond to the sub-pixels of a second color. In particular, the second plurality of micro-LEDs 14b correspond to the sub-pixels for the color of light to be generated by the color conversion agents in the second photocurable composition. For example, assuming the color conversion agents in the second color conversion layer 40b will convert light from the micro-LED 14 into green light, then only those micro-LEDs 14b that correspond to green sub-pixels are turned on.

Figure 3F:
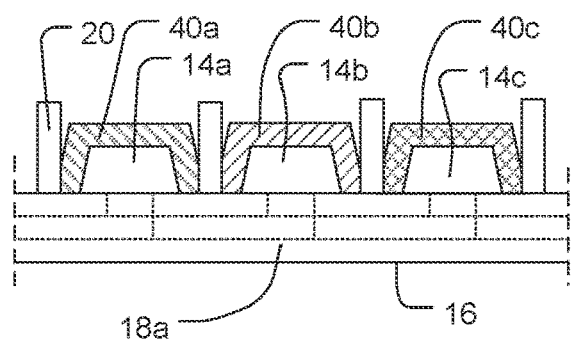

Referring to FIG. 3F, optionally the treatment described above with respect to FIGS. 3A-3D is repeated yet again, but with a third photocurable composition and activation of a third plurality of micro-LEDs 14c. After rinsing, a third color conversion layer 40c is formed over each of the third plurality of micro-LEDs 14c.

The third photocurable composition is similar to the first photocurable composition, but includes color conversion agents to convert the shorter wavelength light from the micro-LEDs 14 into longer wavelength light of a different third color. The third color can be, for example, red.

The third plurality of micro-LEDs 14c correspond to the sub-pixels of a third color. In particular, the third plurality of micro-LEDs 14c correspond to the sub-pixels for the color of light to be generated by the color conversion agents in the third photocurable composition. For example, assuming the color conversion agents in the fluid will convert light from the micro-LED 14 into red light, then only those micro-LEDs 14c that correspond to red sub-pixels are turned on.

In this specific example illustrated in FIGS. 3A-3F, color conversion layers 40a, 40b, 40c are deposited for each color sub-pixel. This is needed, e.g., when the micro-LEDs generate ultraviolet light.

However, the micro-LEDs 14 could generate blue light instead of UV light. In this case, the coating of the display 10 by a photocurable composition containing blue color conversion agents can be skipped, and the process can be performed using the photocurable compositions for the green and red subpixels. One plurality of micro-LEDs is left without a color conversion layer, e.g., as shown in FIG. 3E. The process shown by FIG. 3F is not performed. For example, the first photocurable composition could include green color conversion agents and the first plurality of micro-LEDs 14a could correspond to the green subpixels, and the second photocurable composition could include red color conversion agents and the second plurality of micro-LEDs 14b could correspond to the red subpixels.

Figure 3G:
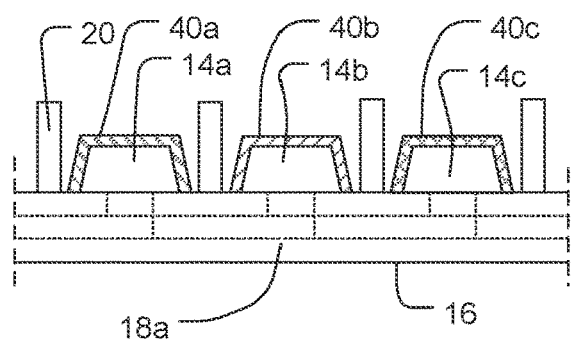

Assuming that the photo curable compositions included a solvent, some solvent may be trapped in the color conversion layers 40a, 40b, 40c. Referring to FIG. 3G, this solvent can be evaporated, e.g., by exposing the micro-LED array to heat, such as by IR lamps. Evaporation of the solvent from the color conversion layers 40a, 40b, 40c can result in shrinking of the layers so that the final layers are thinner.

Removal of the solvent and shrinking of the color conversion layers 40a, 40b, 40c can increase concentration of color conversion agents, e.g., quantum dots, thus providing higher color conversion efficiency. On the other hand, including a solvent permits more flexibility in the chemical formulation of the other components of the photocurable compositions, e.g., in the color conversion agents or cross-linkable components.

Figure 3H:
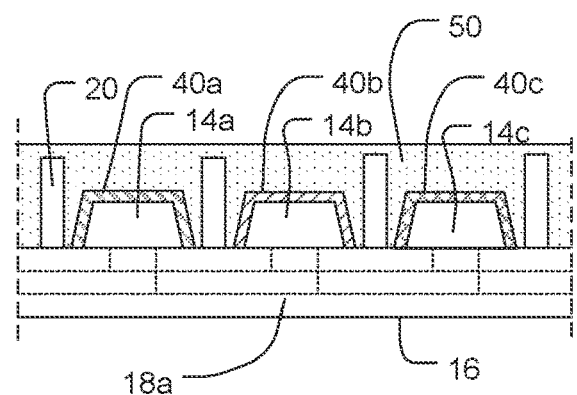

Optionally, as shown in FIG. 3H, a UV blocking layer 50 can be deposited on top of all of the micro-LEDs 14. The UV blocking layer 50 can block UV light that is not absorbed by the color conversion layers 40. The UV blocking layer 50 can be a Bragg reflector, or can simply be a material that is selectively absorptive to UV light (e.g., a benzotriazolyl hydroxyphenyl compound). A Bragg reflector can reflect UV light back toward the micro-LEDs 14, thus increasing energy efficiency. Other layers, such as straylight absorbing layers, photoluminescent layers, and high refractive index layers include materials may also be optionally deposited on micro-LEDs 14.

Thus, as described herein, a photocurable composition includes color conversion agents selected to emit radiation in a first wavelength band in the visible light range in response to absorption of radiation in a second wavelength band in the UV or visible light range, a reactive component (e.g., one or more monomers), and a photoinitiator that initiates polymerization of the active component in response to absorption of radiation in the second wavelength band. The second wavelength band is different than the first wavelength band.

In some implementations, a light-emitting device includes a plurality of light-emitting diodes, and a cured composition in contact with a surface through which radiation in a first wavelength band in the UV or visible light range is emitted from each of the light-emitting diodes. The cured composition includes a nanomaterial selected to emit radiation in a second wavelength band in the visible light range in response to absorption of radiation in the first wavelength band from each of the light-emitting diodes, a photopolymer, and components (e.g., fragments) of a photoinitiator that initiates polymerization of the photopolymer in response to absorption of radiation in the first wavelength band. The second wavelength band is different than the first wavelength band.

In certain implementations, a light-emitting device includes an additional plurality of light-emitting diodes and an additional cured composition in contact with a surface through which radiation in the first wavelength band is emitted from each of the additional light-emitting diodes. The additional cured composition includes an additional color conversion agent selected to emit radiation in a third wavelength band in the visible light range in response to absorption of radiation in the first wavelength band from each of the light-emitting diodes, an additional photopolymer, and components of an additional photoinitiator that initiates polymerization of the photopolymer in response to absorption of radiation in the first wavelength band. The third wavelength band can be different than the second wavelength band.

FIGS. 4A-4E illustrate a method of fabricating a micro-LED array and isolation walls on a backplane. Referring to FIG. 4A, the process starts with the wafer 100 that will provide the micro-LED array. The wafer 100 includes a substrate 102, e.g., a silicon or a sapphire wafer, on which are disposed a first semiconductor layer 104 having a first doping, an active layer 106, and a second semiconductor layer 108 having a second opposite doping. For example, the first semiconductor layer 104 can be an n-doped gallium nitride (n-GaN) layer, the active layer 106 can be a multiple quantum well (MQW) layer 106, and the second semiconductor layer 107 can be a p-doped gallium nitride (p-GaN) layer 108.

Referring to FIG. 4B, the wafer 100 is etched to divide the layers 104, 106, 108 into individual micro-LEDs 14, including the first, second, and third plurality of micro-LEDs 14a, 14b, 14c that correspond to the first, second, and third colors. In addition, conductive contacts 110 can be deposited. For example, a p-contact 110 a and an n-contact 110b can be deposited onto the n-GaN layer 104 and p-GaN layer 108, respectively.

Similarly, the backplane 16 is fabricated to include the circuitry 18, as well as electrical contacts 120. The electrical contacts 120 can include first contacts 120 a, e.g., drive contacts, and second contacts 120 b, e.g., ground contacts.

Referring to FIG. 4C, the micro-LED wafer 100 is aligned and placed in contact with the backplane 16. For example, the first contacts 110 a can contact the first contacts 120 a, and the second contacts 110 b can contact the second contacts 120 b. The micro-LED wafer 100 could be lowered into contact with the backplane, or vice-versa.

Next, referring to FIG. 4D, the substrate 102 is removed. For example, a silicon substrate can be removed by polishing away the substrate 102, e.g., by chemical mechanical polishing. As another example, a sapphire substrate can be removed by a laser liftoff process.

Finally, referring to FIG. 4E, the isolation walls 20 are formed on the backplane 16 (to which the micro-LEDs 14 are already attached). The isolation walls can be formed by a conventional process such as deposition of photoresist, patterning of the photoresist by photolithography, and development to remove the portions of the photoresist corresponding to the recesses 22. The resulting structure can then be used as the display 10 for the processes described for FIGS. 3A-3H.

FIGS. 5A-5D illustrate another method of fabricating a micro-LED array and isolation walls on a backplane. This process can be similar to the process discussed above for FIGS. 4A-4E, except as noted below.

Figure 5A:
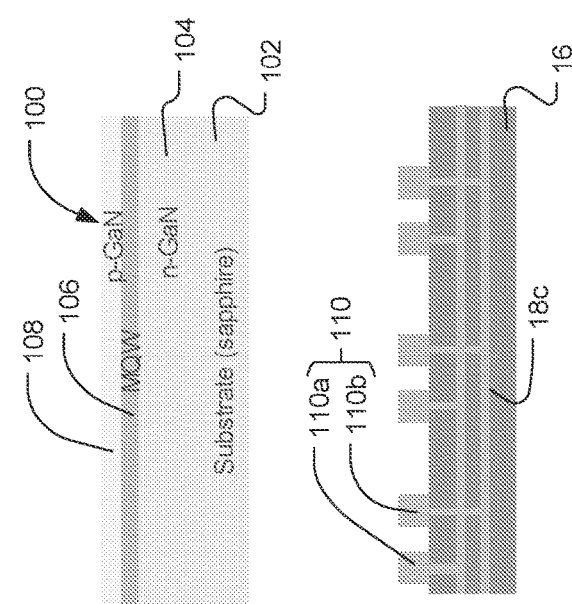
FIGS. 5A-5D illustrate another method of fabricating a micro-LED array and isolation walls on a backplane.

Referring to FIG. 5A, the process starts similarly to the process described above, with the wafer 100 that will provide the micro-LED array and the backplane 16.

Figure 5B:
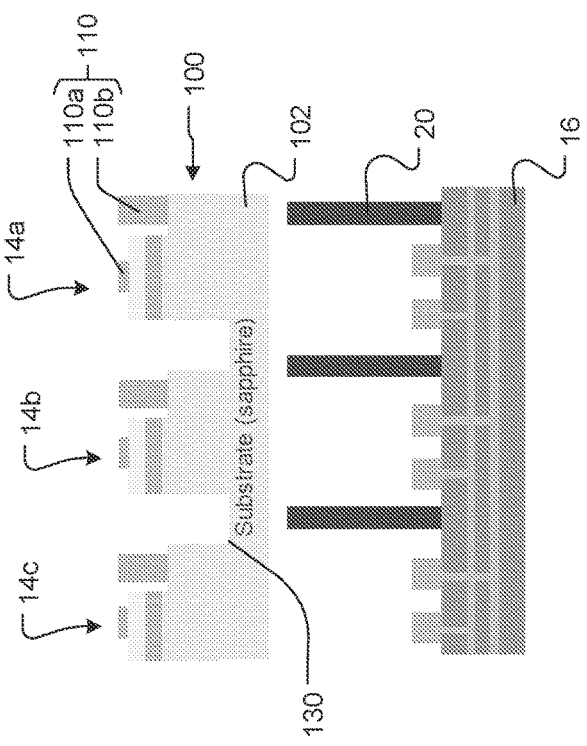

Referring to FIG. 5B, the isolation walls 20 are formed on the backplane 16 (to which the micro-LEDs 14 are not yet attached).

In addition, the wafer 100 is etched to divide the layers 104, 106, 108 into individual micro-LEDs 14, including the first, second and third plurality of micro-LEDs 14 a, 14 b, 14 c. However, the recesses 130 formed by this etching process are sufficiently deep to accommodate the isolation walls 20. For example, the etching can continue so that the recesses 130 extend into the substrate 102.

Figure 5C:
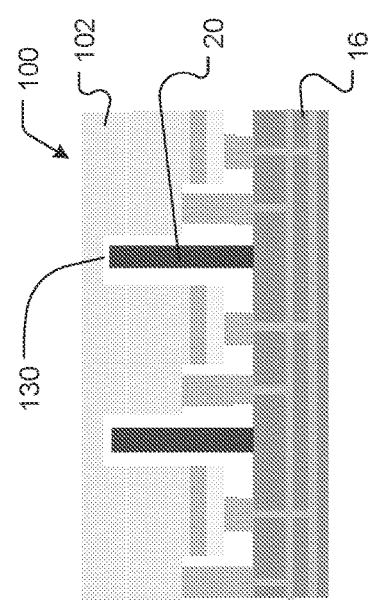

Next, as shown in FIG. 5C, the micro-LED wafer 100 is aligned and placed in contact with the backplane 16 (or vice-versa). The isolation walls 20 fit into the recesses 130. In addition, the contacts 110 of the micro-LEDs are electrically connected to the contacts 120 of the backplane 16.

Figure 5D:
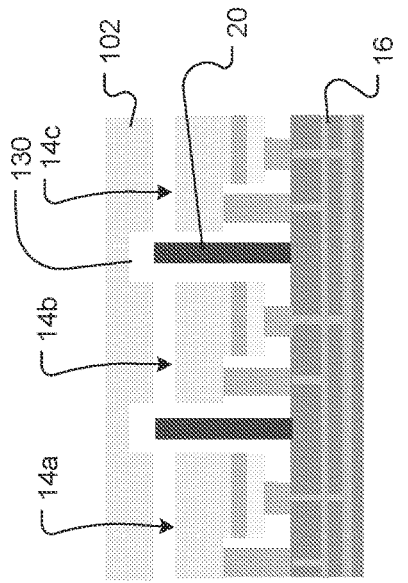

Finally, referring to FIG. 5D, the substrate 102 is removed. This leaves the micro-LEDs 14 and isolation walls 20 on the backplane 16. The resulting structure can then be used as the display 10 for the processes described for FIGS. 3A-3H.

Terms of positioning, such as vertical and lateral, have been used. However, it should be understood that such terms refer to relative positioning, not absolute positioning with respect to gravity. For example, laterally is a direction parallel to a substrate surface, whereas vertically is a direction normal to the substrate surface.

It will be appreciated to those skilled in the art that the preceding examples are exemplary and not limiting. For example, although the above description focuses on micro-LEDs, the techniques can be applied to other displays with other types of light emitting diodes, particularly displays with other micro-scale light emitting diodes, e.g., LEDs less than about 10 microns across.

Although the above description assumes that the order in which the color conversion layers are formed is blue, then green, then red, other orders are possible, e.g., blue, then red, then green. In addition, other colors are possible, e.g., orange and yellow.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A liquid dispersion of quantum dot particles comprising:
   an acrylic monomer medium; and
   quantum dot particles dispersed in the acrylic monomer medium having an initial viscosity, the quantum dot particles comprising ligands attached to the quantum dot particles, the ligands comprising functional groups that stabilize the initial viscosity of the liquid dispersion of quantum dot particles to prevent an increase in the initial viscosity that causes gelling of the liquid dispersion of quantum dot particles, wherein the dispersion comprises 5 to 50 weight % quantum dot particles.

2. The liquid dispersion of quantum dot particles of claim 1, wherein upon exposure to ambient air for 24 hours, the dispersion exhibits a changed viscosity that does not increase more than two times the initial viscosity.

3. The liquid dispersion of quantum dot particles of claim 1, wherein the liquid dispersion further comprises a solvent.

4. The liquid dispersion of quantum dot particles of claim 3, wherein the ligands comprise one or more of dialkylamine ligands and ligands having acid and olefin functional groups.

5. The liquid dispersion of quantum dot particles of claim 4, wherein the ligands having acid and olefin functional groups comprise dodecenoic acid.

6. The liquid dispersion of quantum dot particles of claim 4, wherein the ligands having acid and olefin functional groups comprise 9-dodecenoic acid.

7. The liquid dispersion of quantum dot particles of claim 4, wherein the dialkylamine ligands include an alkyl group having from 4 to 16 carbon atoms.

8. The liquid dispersion of quantum dot particles of claim 7, wherein one or more of dialkylamine ligands are selected from the group consisting of dibutylamine, dihexylamine, dioctylamine dipentylamine, diheptylamine, and dinonylamine.

9. The liquid dispersion of quantum dot particles of claim 7, wherein the acrylic monomer medium comprises one or more of an acrylate monomer, a diacrylate monomer and an acrylamide monomer.

10. The liquid dispersion of quantum dot particles of claim 9, wherein the acrylic monomer medium is selected from the group consisting of hexanediol diacrylate, butanediol diacrylate, ethylene glycol diacrylate, hexyl acrylate, 2-ethylhexyl acrylate, octyl acrylate, 9-(acryloyloxy) nonyl acrylate, isobornyl acrylate, diethylacrylamide and mixtures thereof.

11. The liquid dispersion of quantum dot particles of claim 10, wherein the acrylic monomer medium is hexanediol diacrylate.

12. The liquid dispersion of quantum dot particles of claim 1, wherein the ligand comprises 9-dodecenoic acid and the acrylic monomer medium comprises hexanediol diacrylate.

13. The liquid dispersion of quantum dot particles of claim 1, wherein the quantum dot particles comprise III-V compounds.

14. The liquid dispersion of quantum dot particles of claim 13, wherein the quantum dot particles are selected from the group consisting of CdSe, CdS, InP, PbS, CuInP, ZnSeS, and GaAs.

15. The liquid dispersion of quantum dot particles of claim 1, wherein the ligands are not reactive with the acrylic monomer.

16. A liquid dispersion of quantum dot particles comprising:
an acrylic monomer medium comprising hexanediol diacrylate; and
quantum dot particles dispersed in the acrylic monomer medium having an initial viscosity, the quantum dot particles comprising ligands comprising 9-dodecenoic acid attached to the quantum dot particles, the ligands comprising functional groups that stabilize the initial viscosity of the liquid dispersion of quantum dot particles to prevent an increase in the initial viscosity that causes gelling of the liquid dispersion of quantum dot particles.

17. The liquid dispersion of quantum dot particles of claim 16, wherein upon exposure to ambient air for 24 hours, the dispersion exhibits a changed viscosity that does not increase more than two times the initial viscosity.

18. The liquid dispersion of quantum dot particles of claim 16, wherein the liquid dispersion further comprises a solvent.

19. The liquid dispersion of quantum dot particles of claim 16, wherein the quantum dot particles comprise III-V compounds.

20. The liquid dispersion of quantum dot particles of claim 16, wherein the quantum dot particles are selected from the group consisting of CdSe, CdS, InP, PbS, CuInP, ZnSeS, and GaAs.

21. The liquid dispersion of quantum dot particles of claim 16, wherein the ligands are not reactive with the acrylic monomer.

\* \* \* \* \*